(12) United States Patent
Gratrix (10) Patent No.: US 6,709,790 B1
(45) Date of Patent: Mar. 23, 2004

(54) METHOD AND APPARATUS FOR GENERATING PERIODIC STRUCTURES IN SUBSTRATES BY SYNTHETIC WAVELENGTH HOLOGRAPH EXPOSURE

(75) Inventor: Edward Gratrix, Trumbull, CT (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 08/581,888

(22) Filed: Jan. 2, 1996

Related U.S. Application Data (63) Continuation of application No. 08/268,209, filed on Jun. 29, 1994, now abandoned, which is a continuation-in-part of application No. 07/935,617, filed on Aug. 26, 1992, now abandoned.

(51) Int. Cl.[7] .................................................. G03H 1/00
(52) U.S. Cl. ........................ 430/1; 430/2; 430/320; 430/290; 359/1; 359/3; 359/10; 359/11; 359/22; 359/24
(58) Field of Search ........................ 430/1, 2, 945, 430/290, 321; 359/1, 3, 10, 11, 22, 24

(56) References Cited

U.S. PATENT DOCUMENTS

| | | | | |
|---|---|---|---|---|
| 3,453,640 A | * | 7/1969 | Blackmer | 359/569 |
| 3,503,050 A | * | 3/1970 | Schouls et al. | 430/1 |
| 3,594,060 A | * | 7/1971 | Lowe | 359/24 |
| 3,728,117 A | * | 4/1973 | Heidenhain et al. | 430/321 |
| 3,829,219 A | * | 8/1974 | Wyant | 350/162 |
| 3,945,825 A | * | 3/1976 | Gale et al. | 359/3 |
| 3,975,081 A | * | 8/1976 | Kato et al. | 359/22 |
| 4,094,575 A | * | 6/1978 | Kellie | 359/10 |
| 4,155,630 A | * | 5/1979 | Ih | 359/10 |
| 4,208,637 A | * | 6/1980 | Matsuda et al. | 359/1 |
| 4,245,882 A | * | 1/1981 | Chang | 350/3.77 |
| 4,360,251 A | * | 11/1982 | Rajchman | 359/567 |
| 4,498,729 A | * | 2/1985 | Benton | 359/10 |
| 4,514,479 A | * | 4/1985 | Ferrante | 430/321 |
| 4,566,757 A | * | 1/1986 | Fusek et al. | 359/900 |
| 4,737,448 A | * | 4/1988 | Hochberg | 430/321 |
| 4,859,548 A | * | 8/1989 | Heise et al. | 430/1 |
| 5,120,621 A | * | 6/1992 | Ramsbottom | 430/1 |
| 5,124,216 A | * | 6/1992 | Giapis et al. | 430/945 |
| 5,225,918 A | * | 7/1993 | Taniguchi et al. | 359/12 |

FOREIGN PATENT DOCUMENTS

| | | | | |
|---|---|---|---|---|
| GB | 2212935 | * | 8/1989 | 359/569 |
| JP | 60164701 | * | 8/1985 | 430/1 |
| JP | 60-164701 | * | 8/1985 | 430/1 |
| JP | 63-60587 | * | 3/1988 | 430/321 |

OTHER PUBLICATIONS

Translation of JP 60–164701 (Ujiie).*
Translation of JP 63–060587 (Kotaki et al.).*
Jenkins and White, "Fundamentals of Optics" pp 246–248. (1976).*
Fillmore et al. "Sensitometric Charachtoristic of Hardened Gelating films" JOSA 64(2) pp 199–203. (Feb. 1971).*
Fillmore et al. "Sensitometric . . ." JOSA (Feb. 1971) 199–103.*
Jenkins & White "Fundamentals of Optics" pp 268–270 ©1976.*
Sonek et al. "Ultraviolet grating polarizers" J. Vac. Sci Technol 19(4) pp 921–3 (Dec. 1981).*
Fillmore et al Sensitomeric Characteristics of Hardened Dichromated–Gelatin Films. JOSA 61(2) pp 199–203 (Feb. 1971).*

* cited by examiner

Primary Examiner—Martin Angebranndt
(74) Attorney, Agent, or Firm—Sawyer Law Group LLP (57) ABSTRACT

A substrate surface 10 having a photo-sensitive material surface thereon is simultaneously exposed to four plane waves of light at angles of incidence $\theta$, $-\theta$, $\phi$ and $-\phi$ subtending from the normal of the surface. The four plane waves create an interference pattern on the substrate so as to cause the formation of a periodic structure on the photo-sensitive material surface of the substrate.

16 Claims, 8 Drawing Sheets

METHOD AND APPARATUS FOR GENERATING PERIODIC STRUCTURES IN SUBSTRATES BY SYNTHETIC WAVELENGTH HOLOGRAPH EXPOSURE

This is a continuation of application of Ser. No. 268,209 filed Jun. 29, 1994 now abandoned, which is a continuation-in-part application Ser. No. 07/935,617 filed Aug. 26, 1992, now abandoned.

FIELD OF THE INVENTION

The present invention relates to a method and apparatus for generating diffraction gratings on a photo-sensitive material on a substrate, and more particularly, the present invention relates to a method and apparatus for generating sinusoidal structures on photo-sensitive material on substrates by the recordation of an interference pattern produced by four plane waves of light incident thereon.

BACKGROUND OF THE INVENTION

Two dimensional periodic structures such as gratings, echelles and rulings are used in many optical systems. Developments in laser technology have provided dramatic improvement in the understanding and fabrication of these structures. For example, the brightness and coherence of laser light has permitted accurate measurement, control and generation of periodic structures. The ability to expose photo-resist materials with lasers has lead to a holographic method of fabricating such structures. Gratings made by the holographic method are commonly referred to as holographic or interference gratings, and such gratings can be made with exceptional accuracy and clarity when compared to alternative prior art methods such as mechanical ruling and lithography.

As with all methods of grating fabrication, two basic problems occur. First, it is difficult to produce a consistent groove shape. Any variations in the shape of the groove will generate stray light and alter the efficiency. Second, it is difficult to ensure that each groove is in the correct position, or alternatively stated, that the period of the grooves is consistent. Low frequency errors in the period of the grooves will effect the quality of the diffracted wavefront and will cause distortion in the spectral imaging properties of the grating. Middle and high frequency errors in the period will alter the level of light which is found between diffracted orders. Low, middle and high frequency periodic errors in general are responsible for the generation of "ghosts" in the field and random errors in the period give rise to background scatter known as "grass".

The current techniques for fabricating accurate gratings are mechanical ruling, lithograph and interference.

The mechanical ruling method is known to create the greatest amount of stray light, grass and ghostings in gratings. Masks generated by Lithographic techniques (locally exposing a photo-sensitive material with a serially scanned, high energy electron beam have limited control over the groove shape. Errors in the fabrication of such gratings by this technique depend on the exposure apparatus. The trajectory of the electron beam is a raster exposure over discrete blocks of an entire grating pattern. Such technique results in "stitching" errors. Gratings generated by the recording of interference patterns on a photo-sensitive material are known to produce the lowest stray light, have superior wavefront quality and be practically free of ghosts and grass. Drawbacks to the recording of interference pattern technique include the limited control over the groove shape, grating period and overall area of exposure.

Two beam interference pattern recordation for the fabrication of gratings is well known. Such a technique comprises exposing a photo-sensitive material to the intensity pattern generated by the interference of two plane waves of light at equal and opposing angles from a normal to the photo-sensitive material surface. Subsequent development of the exposed and unexposed photo-sensitive material yields a surface having a periodic grating structure due to the preferential dissolution of the resist in the presence of the developer. The period of the resulting structure is determined by the equation.

$$\Lambda = \frac{\lambda}{2n\sin\theta}$$

where $\Lambda$ is the period of the grating, $\lambda$ is the wavelength of light, n is the index of refraction of the medium where interference occurs and $\theta$ is the angle of the incident light on the surface of the substrate as measured to the normal of the surface. For periods much larger than the wavelength of the light (where $\Lambda$ is much greater than $\lambda$), very small angles of incidence are necessary. The small angular displacements required for relatively large periods severely limit the size of a region of a substrate which can be exposed to the interference pattern. For example, the generation of interference patterns having periods separated by 20 microns with light of a 0.488 $\mu$m wavelength require the incident plane waves of light to be 1.45 degrees from the normal drawn from the surface. Slight variations in the incident angle will cause dramatic changes in the period. Variations in the incident angle on the local scale are equivalent to wavefront distortions. For accurate generation of ronchi rulings using two beam interference, there are excessive burdens on the engineering of exposure optics. The sensitivity of variations in the incident angle makes the two-beam approach difficult to implement.

The method and apparatus of the present invention utilizes a four plane wave holographic approach which allows for much larger exposure areas on a photo-sensitive substrate. The method and apparatus of the present invention also allows creation of a period by choosing the angles of incidence for the various plane waves.

SUMMARY OF THE INVENTION

The present invention relates to a method and apparatus for fabricating diffraction gratings on a substrate having a photo-sensitive material thereon. The method comprises the step of simultaneously exposing the photo-sensitive material on the substrate to an interference pattern produced by a first pair and a second pair of plane waves. Each plane wave of the first pair is incident on the substrate at an equal but opposing angle $\theta$, $-\theta$ of incidence subtending from a line normal to the substrate surface. Each plane wave of the second pair is incident on the substrate at an equal but opposing angle $\phi$, $-\phi$ of incidence also subtending from a line normal to the substrate surface. The pattern of interference may be controlled by changing the angles of incidence of the first pair of plane waves and the angles of incidence of the second pair of plane waves. After exposure, the photo-sensitive material is developed so as to remove material exposed to incident light.

An object of the present invention is to provide a method and apparatus for fabricating gratings on a substrate having a photo-sensitive material thereon.

Another object of the present invention is to provide a four plane wave holographic method and apparatus for exposing substrates having photo-sensitive materials thereon to larger areas of interference patterns.

Other objects and advantages of the present invention will become apparent to those skilled in the art from the following detailed description read in conjunction with the attached drawings and claims appended hereto.

DETAILED DESCRIPTION OF THE INVENTION

Figure 1:
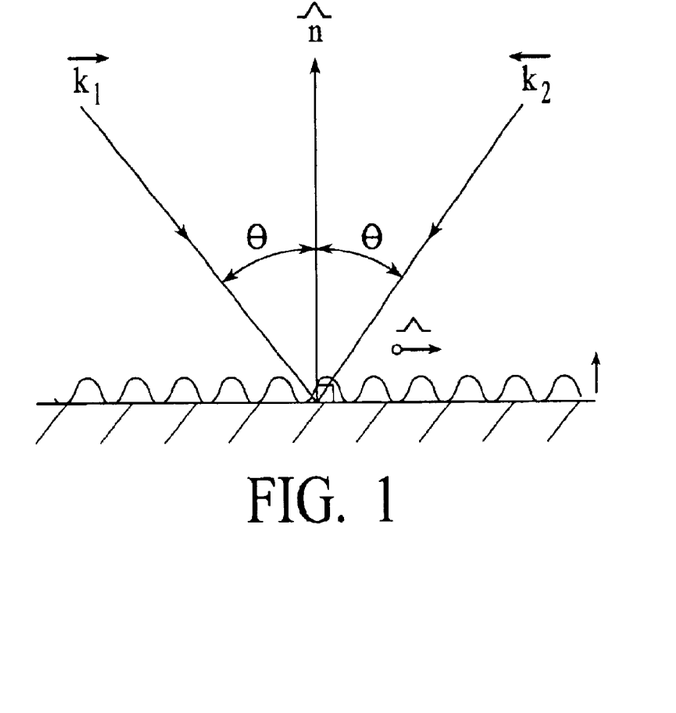
FIG. 1 is a schematic diagram of a two plane wave approach.
Figure 2:
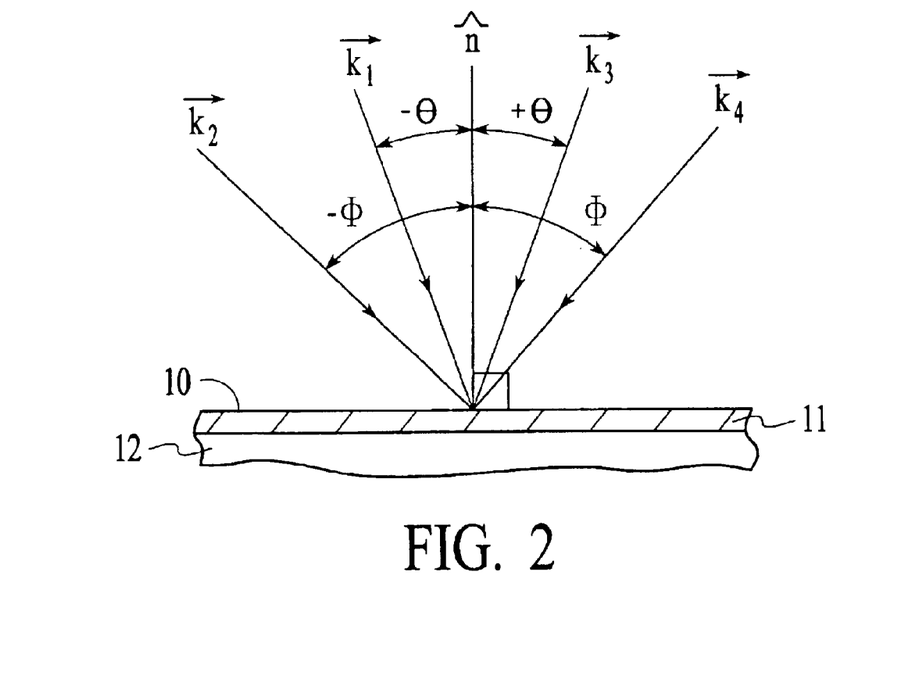
FIG. 2 is a schematic diagram of the present invention wherein four plane waves are incident on a substrate surface.

Referring to FIG. 2, the present invention comprises the step of exposing a surface 10 of a photo-sensitive material 11 on a substrate 12 to four plane waves of light, represented by vectors k1, k2, k3 and k4. The photo-sensitive material may be ordinary photo-resist. Plane wave vectors k1 and k3 are incident on the surface 10 at angles of incidence, θ and −θ, as measured from normal n of the surface. Plane wave vectors k2 and k4 are incident on the surface 10 at angles of incidence, φ and −φ, also measured from normal n. The value of angle φ is always is greater than θ and less than 90 degrees. The value of −φ is always less than −θ and greater than −90 degrees.

Figure 4A:
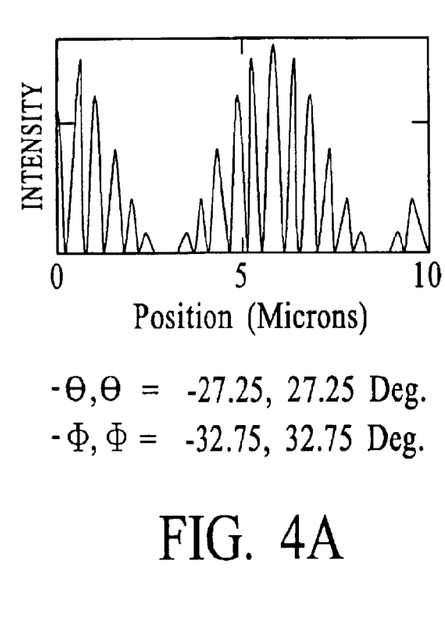
FIG. 4a is a graph of an interference pattern generated by the method of the present invention for a wavelength of light equal to 0.488 μm, a first and second angle of incidence, θ and −θ, equal to 27.25 and −27.25 degrees, respectively, and a third and forth angle of incidence, φ, and −φ equal to 32.75 and −32.75 degrees, respectively.

FIG. 4a shows a graphical representation of an interference pattern generated on the surface 10 using a wavelength of 0.488 μm for the four plane waves of light k1, k2, k3, and k4. The pattern shown is produced when the angles of incidence, θ and −θ, of the first pair of plane waves are 27.25 degrees and −27.25 degrees, respectively, and the angles of incidence, φ and −φ, of the second pair of plane waves are 32.75 degrees and −32.75 degrees, respectively. The substrate can be dithered perpendicular to the interference pattern so as to wash out any fine structure of the interference pattern. The range of dithering motion need only be equal to the size of the spacing between the fine interference peaks. For example, the substrate need only be moved approximately 1 μm to wash out the fine structure when using light having a wavelength of 0.488 μm and where θ and −θ are equal to 27.25 degrees and −27.25 degrees, respectively and φ and −φ are equal to 32.75 degrees and −32.75 degrees, respectively. The fine structure may also be washed out by modulating the phase of one or more of the interfering plane waves. The removal of the fine structure from the substrate adds some light to the positions where zero intensity normally occurs, and thus, results in a slight bias in the overall intensity of the exposure of the substrate.

Figure 4B:
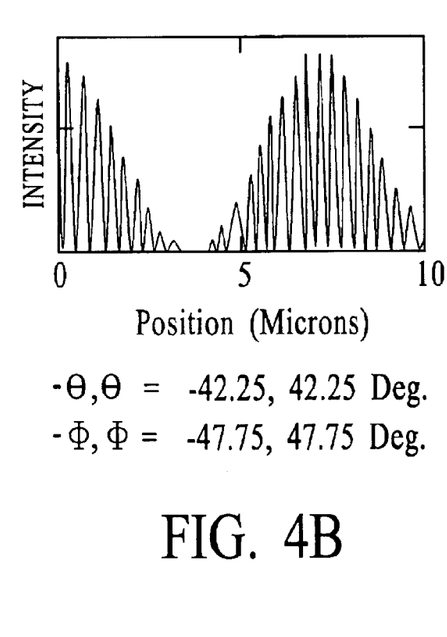
FIG. 4b is a graph of an interference pattern generated by the method of the present invention for a wavelength of light equal to 0.488 μm, a first and second angle of incidence, θ and −θ, equal to 42.25 and −42.25 degrees, respectively, and a third and forth angle of incidence, φ and −φ, equal to 47.75 and −47.75 degrees, respectively.
Figure 4C:
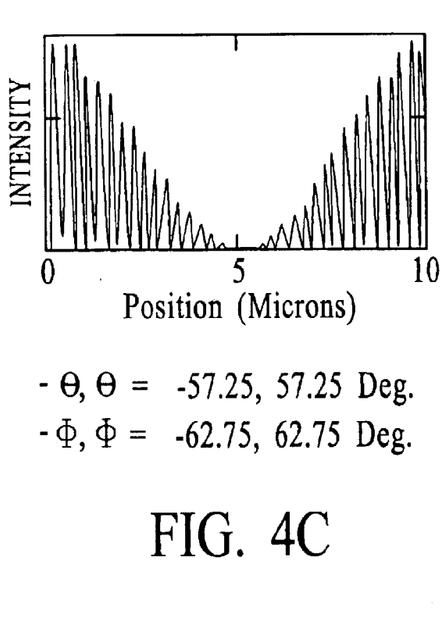
FIG. 4c is a graph of an interference pattern generated by the method of the present invention for a wavelength of light equal to 0.488 μm, a first and second angle of incidence, θ and −θ, equal to 57.25 and −57.25 degrees, respectively, and a third and forth angle of incidence, φ and −φ, equal to 62.75 and −62.75 degrees, respectively.

FIG. 4b shows a graphical representation of an interference pattern generated on the surface 10 when a wavelength of 0.488 μm is used for the four plane waves of light, k1, k2, k3, and k4, and 42.25 and −42.25 degrees for θ and −θ, respectively, and 47.75 and −47.75 degrees for φ and −φ, respectively. FIG. 4c shows a graphical representation of an interference pattern generated on the surface 10 when a wavelength of 0.488 μm is used for the four plane waves of light, k1, k2, k3, and k4, and 57.25 and −57.25 degrees for θ and −θ, respectively, and 62.75 and −62.75 degrees for φ and −φ, respectively.

Figure 3A:
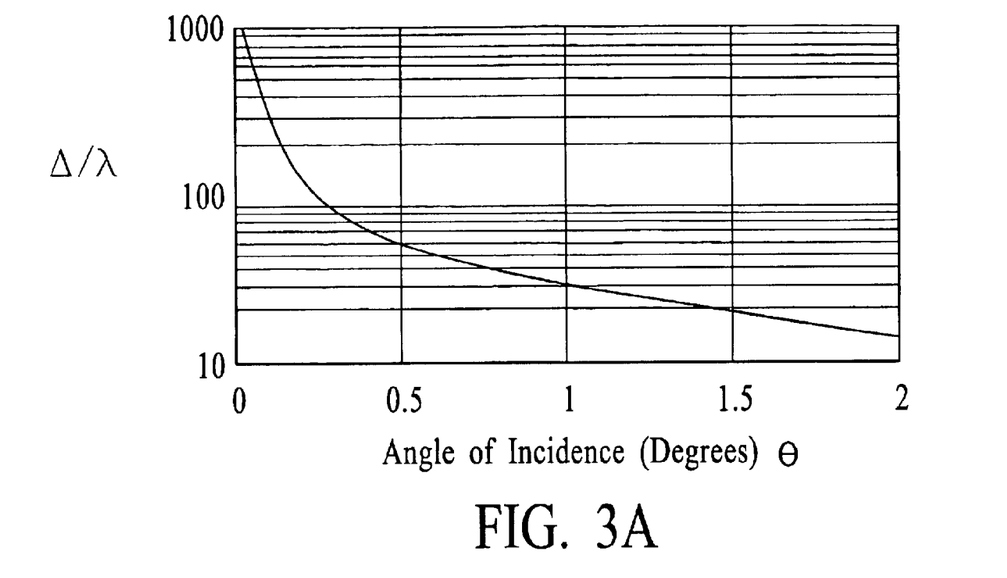
FIG. 3a is a graph of the period to wavelength ratio versus the angle of incident for the two-beam approach of the prior art showing the principle that for periods greater than the wavelength of light, much smaller angles of incidence are necessary.
Figure 3B:
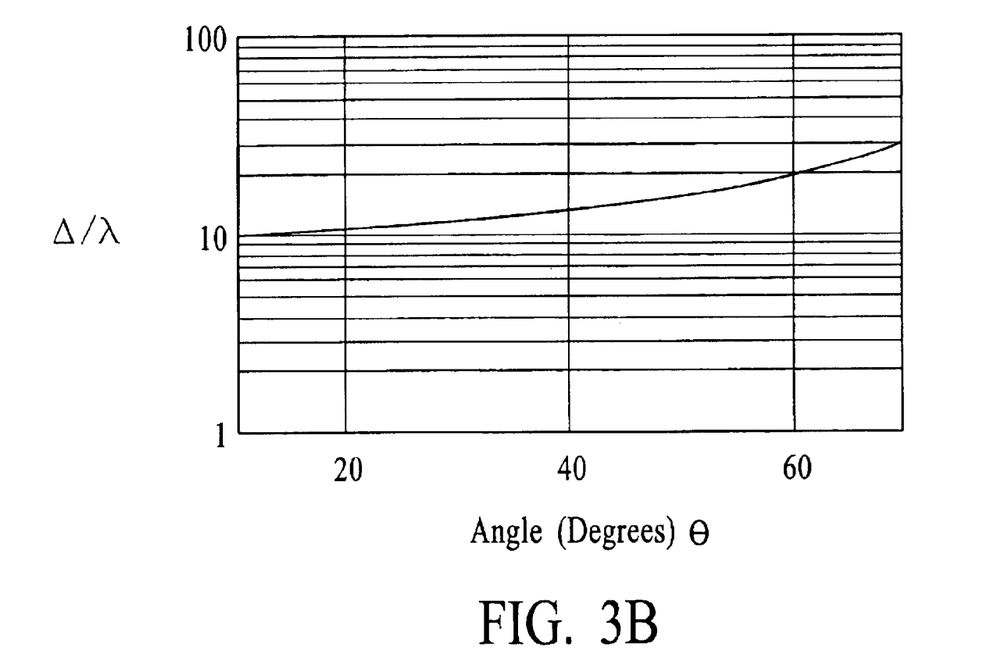
FIG. 3b is a graph of the period to wavelength ratio versus the angle of incidence, θ, for the four beam approach of the present invention.

Comparing FIG. 3a with FIG. 3b, it is readily apparent from the two graphical plots of the period to wavelength ratio versus the angle of incidence that the two plane wave approach is very sensitive to changes in the angle of incidence and, thus, makes the two plane wave approach difficult to implement. The four plane wave approach is less sensitive to small changes in the angle of incidence and extends the range of the period to many times the wavelength.

Figure 5:
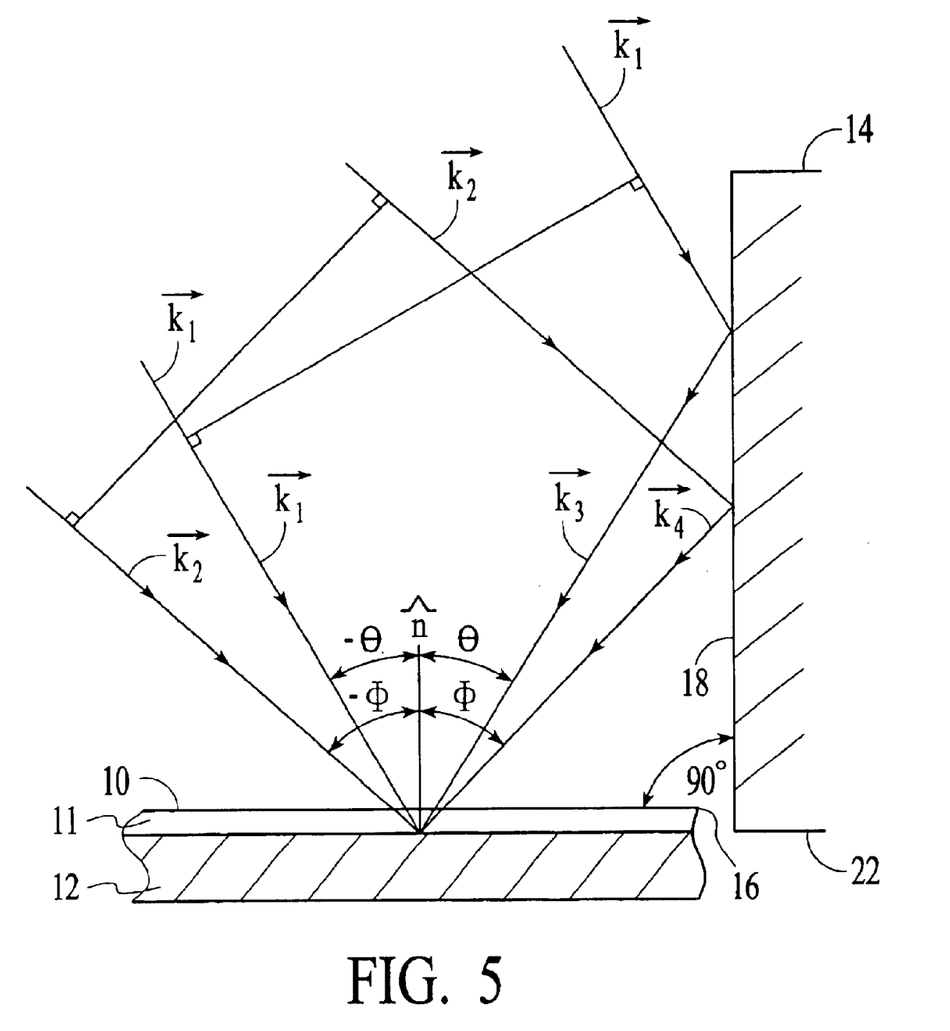
FIG. 5 is a schematic diagram of an apparatus for carrying out the method of the present invention wherein the two pairs of plane waves are incident on the substrate surface by illumination of a corner mirror adjacent to a first of the substrate from a first side of the substrate.

Referring to FIG. 5, the photo-sensitive material 11 on the substrate 12 can be exposed to the four plane waves of light k1, k2, k3, and k4 by projecting plane wave k1 at the substrate 12 at angle of incidence θ from the normal n and projecting plane wave k2 at angle of incidence φ while a mirror 14 is positioned adjacent to a first end 16. The mirror is also positioned so as to place reflective surface 18 of the mirror 14 at a 90 degree angle subtending from the photo-sensitive surface 10 to the reflective surface 18. Plane wave k1 reflects off of the reflective surface 18 of the mirror 14 to form plane wave k3 which is incident on the photo-sensitive material 11 at an angle of incidence −θ subtending from the normal n. Plane wave k2 reflects off of the reflective surface 18 to form plane wave k4 which is incident on the photo-sensitive material at an angle of incidence equal to −φ subtending from the normal n. The period of intensity may be tuned by angular rotation of the mirror 14 and the photo-sensitive material surface 10 with respect to the incident light so as to change the angle of incidence of light on the reflective surface 18 of the mirror 14 and the surface 10 of the photo-sensitive material 11. This correspondingly changes angles of incidence θ, −θ, φ and −φ.

Figure 6:
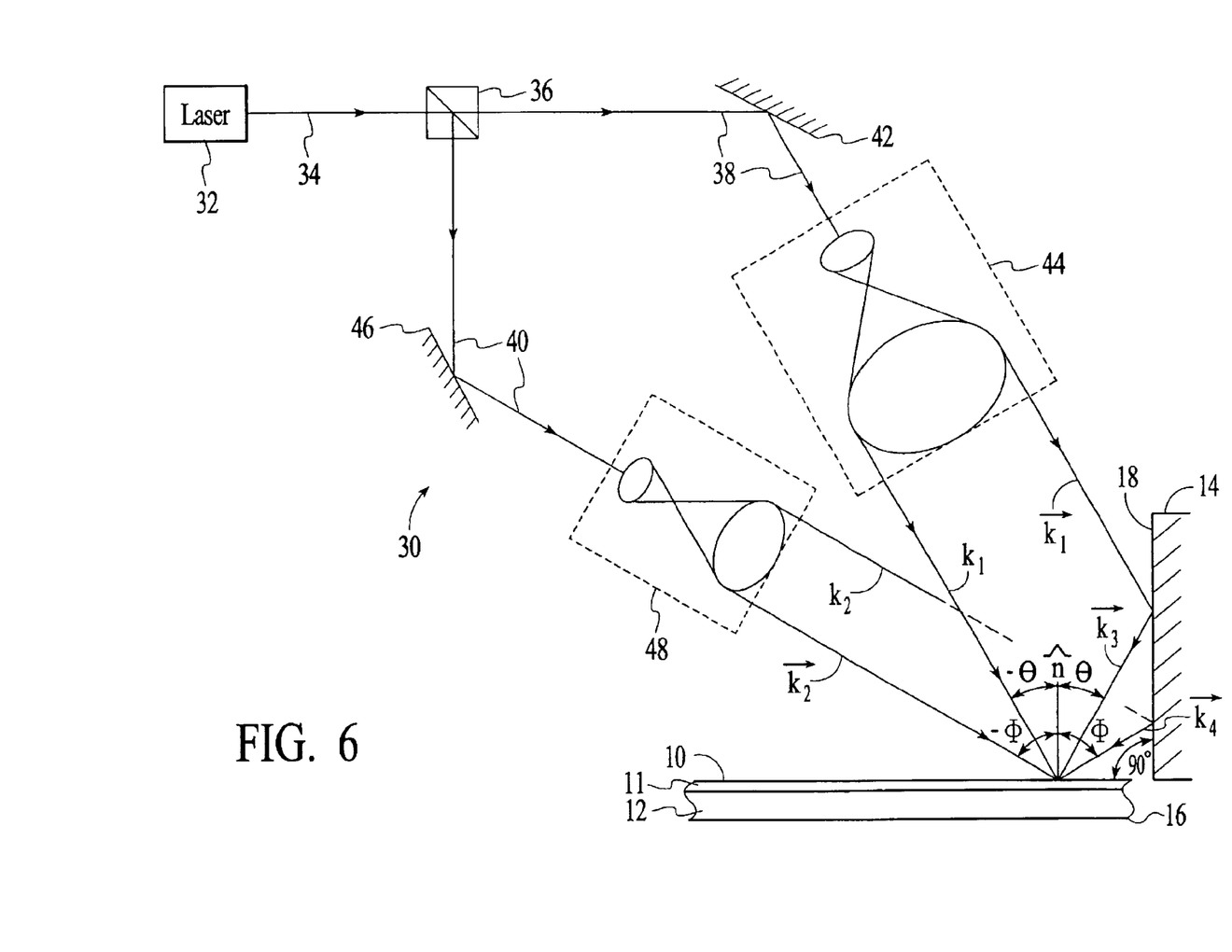
FIG. 6 is a schematic diagram of an apparatus for supplying light to the apparatus of FIG. 5.

FIG. 6 illustrates an apparatus for providing the two plane waves of light. The apparatus 30 comprises a laser 32 having a beam 34 of coherent light aimed at a beam splitter 36. The beam splitter 36 divides the light from the laser 32 equally into a first beam 38 and a second beam 40. A first mirror 42 redirects beam 38 into a first beam expander 44. The first beam expander 44 enlarges the cross-section of beam 38 so as to create plane wave k1 to cover a desired area to be exposed on the surface 10 of the photo-sensitive material 11 on the substrate 12. Likewise, a second mirror 46 redirects second beam 40 into a second beam expander 48 wherein the beam is enlarged in-cross section so as to create plane wave k2.

Figure 7:
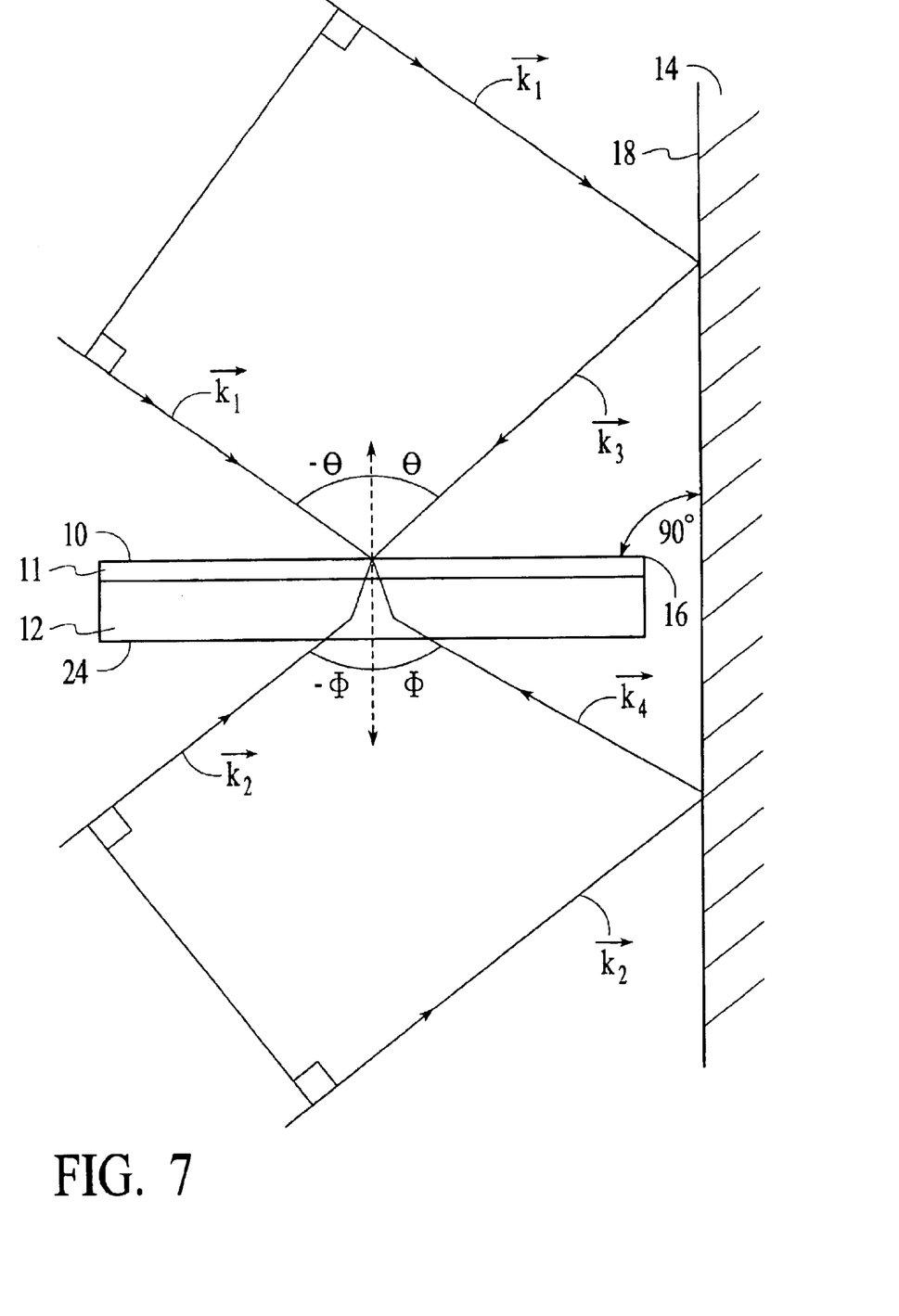
FIG. 7 is a schematic diagram of another embodiment of the present invention wherein two pairs of plane waves are incident on a first and second substrate surface by illumination of the two surfaces of the substrate and by illumination of an adjacent mirror.

FIG. 7 illustrates another embodiment wherein the mirror 14 is positioned adjacent to the substrate 12 so as to form a 90 degree angle subtending from the reflective surface 18 to the photo-sensitive material 11. Plane wave k1 is projected so as to be incident on the surface 10 of the photo-sensitive material 11 on the substrate 12 at an angle of incidence θ and on the mirror so as to reflect off of its first side and create plane wave k3 incident on the first surface at angle of incidence −θ subtending from normal n. The embodiment illustrated in FIG. 5 differs from that shown in FIG. 7 in that plane wave k2 is projected so as to be incident on surface 24 of the substrate at an angle of incidence φ and incident on the mirror so as to reflect off of its first side and create plane wave k4 incident on the second side of the substrate at angle of incidence −φ subtending from normal n'. Plane waves k2 and k4 undergo a wavelength change upon entering the second side 24 of the substrate which exactly compensates for the refraction angle caused by the substrate 12.

Figure 8:
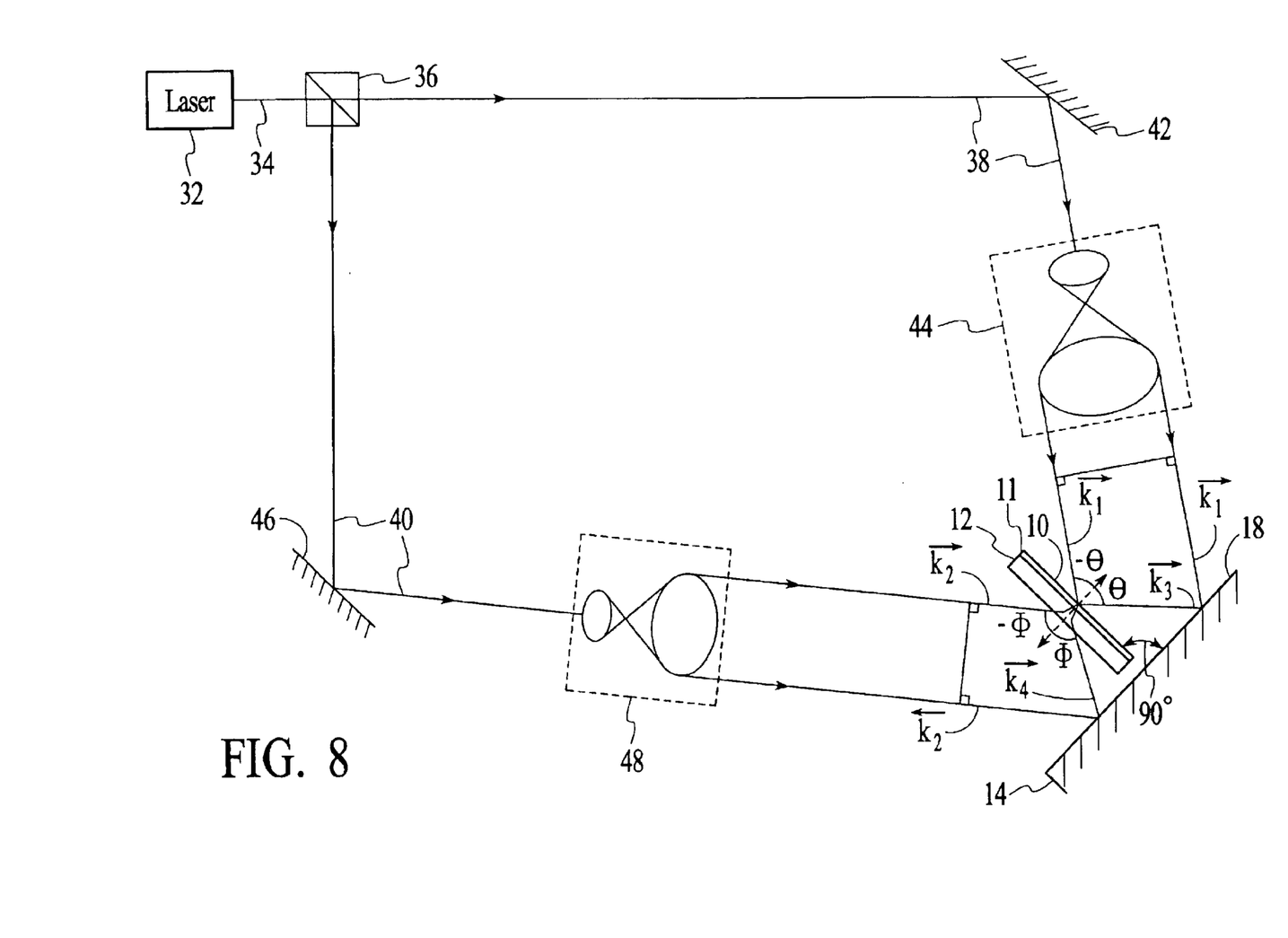
FIG. 8 is a schematic diagram of an apparatus for supplying light to the apparatus of FIG. 7.
Figure 9A:
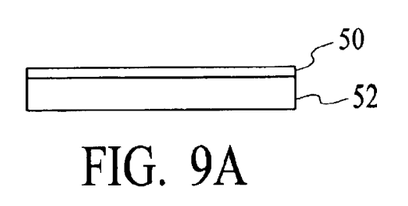
FIGS. 9a–9f illustrate a process for preparing a ronchi ruling using the method of the present invention.
Figure 9B:
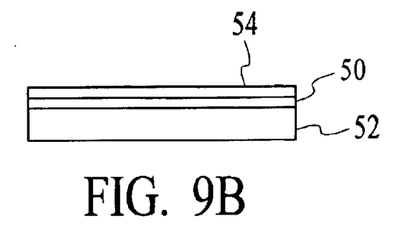
Figure 9C:
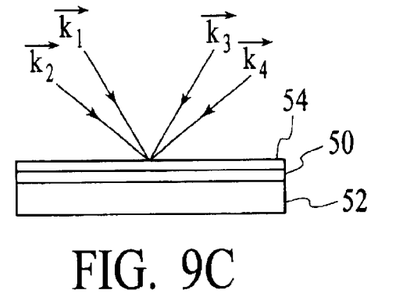
Figure 9D:
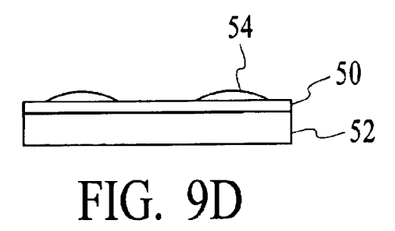
Figure 9E:
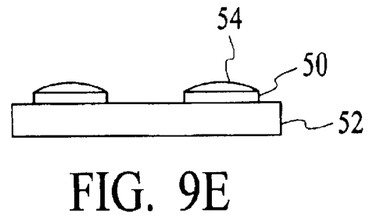
Figure 9F:
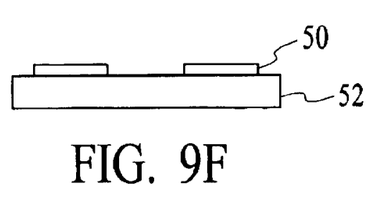

FIG. 8 illustrates an apparatus nearly identical to that illustrated in FIG. 6. However, the mirror 14 and substrate 12 have been rotated with respect to the plane waves k1 and k2, so as to permit plane waves k2 and k4 to illuminate the second side 24 of the substrate 12.

By exposing the photo-sensitive material 11 to the interference pattern caused by plane waves k1, k2, k3 and k4, and developing the photo-sensitive material by using developing techniques well known in the art, a periodic structure can be created by synthetic holographic exposure of a substrate. Photo-sensitive material exposed to light will react with developing chemicals so as to "etch" away leaving a void behind. The degree of etching is determined by the length of time the photo-sensitive material is exposed to light, the intensity of the light, and the length of time the photo-sensitive 10 material is exposed to the developing chemicals.

FIGS. 9a through 9f illustrate a process for fabricating a ronchi ruling. An opaque material 50, such as chromium, is applied to the surface of a substrate 52. A photo-sensitive material 54, such as a photo-resist, is then applied over the opaque material 50 and the combination is baked so as to cure the opaque and the photo-resist. Next, the photo-resist is exposed for a period of time to one of the methods for exposing the photo-resist to four plane waves of light described above. After the exposure period, the photo-resist 54 is controllably developed so as to yield an exposed region of opaque material 50. Following development of the photo-resist, the exposed opaque 50 material is preferentially etched. Finally, the remaining undeveloped resist 54 is stripped off of the remaining opaque material. The simple process described above yields an opaque/clear ronchi ruling having features which are manufactured to holographic tolerances.

Thus, what has been described is a method and apparatus for generating periodic structures by synthetic wavelength holographic exposure of a substrate. While the preferred embodiment of the present invention has been described and illustrated, it may be understood by a person skilled in the art that the preferred embodiment is capable of variation, addition, omission and modification without departing from the spirit and scope of the invention.

What is claimed is:

1. A method of forming periodic structures in a photo-sensitive material on a substrate, comprising the steps of:

forming a beat pattern by simultaneously superimposing first and second pairs of plane waves of light of the same monochromatic wavelength on a surface of said photo-sensitive material so as to produce an interference pattern thereon, wherein the first plane wave of light of said first pair is incident on said surface at a first angle of incidence θ subtending from the normal of the surface, wherein the second plane wave of light of said first pair is incident on said surface at a second angle of incidence −θ subtending from the normal of the surface, wherein a first plane wave of light of said second pair is incident on said surface at a third angle of incidence φ subtending from the normal of the surface, and wherein a second plane wave of light of said second pair is incident on said surface at a fourth angle of incidence −φ subtending from the normal of the surface; and developing the photo-sensitive material, wherein the beat pattern includes fine interference structure having a varying intensity defining coarse interference structure that defines a desired optical periodic structure, and wherein the substrate is dithered perpendicular to the interference pattern during said exposure step to wash out the fine interference structure while preserving the coarse interference structure.

2. The method of claim 1, wherein θ<than φ<90°.

3. The method of claim 2, wherein θ and φ differ by approximately 5.50° for a wavelength of said light of approximately 0.488 μm.

4. The invention of claim 1 wherein said coarse structure has a period that is substantially greater than the wavelength of light of said first and second pairs of plane waves of light.

5. A method for generating periodic structures on a substrate having a photosensitive material surface, comprising the steps of:

forming a beat pattern by simultaneously superimposing first, second, third and fourth plane waves of light of the same monochromatic wavelength on a surface of said photo-sensitive material, wherein said first plane wave of light is incident on said substrate at an angle of incidence θ subtending from the normal to said surface, wherein said second plane wave of light is incident on said substrate at an angle of incidence φ subtending from the normal, wherein said third plane wave of light is incident on said substrate at an angle of incidence −θ subtending from the normal, and wherein said fourth plane of light is incident on said substrate at an angle of incidence −φ subtending from the normal; and developing said photo-sensitive material surface as to remove photo-sensitive material exposed to light, wherein the beat pattern includes fine interference structure having a varying intensity defining coarse interference structure that defines a desired optical periodic structure, wherein the substrate is dithered perpendicular to the interference pattern during said exposure step to wash out the fine interference structure while preserving the coarse interference structure.

6. The method of claim 5, wherein $\theta<\phi<90°$.

7. The method of claim 6, wherein $\theta$ and $\phi$ differ by approximately 5.50° for a wavelength of said light of approximately 0.488 μm.

8. The invention of claim 5 wherein said coarse structure has a period that is substantially greater than the wavelength of light of said first, second, third and fourth plane waves of light.

9. A method for generating periodic structures on a light transmissive substrate having a first surface, a second surface opposite of said first surface, and a photosensitive material surface on said first surface, said method comprising the steps of:

forming a beat pattern by simultaneously superimposing first, second, third and fourth plane waves of light of the same monochromatic wavelength on a surface of said photo-sensitive material by:

exposing said first surface of said substrate to the first plane wave of light incident on said first surface at an angle of incidence $\theta$ subtending from normal n to said first surface and the second plane wave of light incident on said substrate at an angle of incidence $-\theta$ subtending from the normal and exposing said second surface of said substrate to the third plane wave of light incident on said second surface at an angle of incidence $\phi$ subtending from the normal to said second surface and the fourth plane wave of light incident on said substrate at an angle of incidence $-\phi$ subtending from the normal, wherein said first, second, third and fourth plane waves of light are of the same monochromatic wavelength and said first and second surfaces of said substrate are exposed simultaneously; and developing said photo-sensitive material so as to remove photo-sensitive material exposed to light, wherein the beat pattern includes fine interference structure having a varying intensity defining coarse interference structure that defines a desired optical periodic structure, wherein the substrate is dithered perpendicular to the interference pattern during said exposure step to wash out the fine interference structure while preserving the coarse interference structure.

10. The method of claim 9, wherein $\theta<\phi<90°$.

11. The method of claim 10, wherein $\theta$ and $\phi$ differ by approximately 5.50° for a wavelength of said light of approximately 0.488 μm.

12. The invention of claim 9, wherein said coarse structure has a period that is substantially greater than the wavelength of light of said first, second, third and fourth plane waves of light.

13. A method of making ronchi rulings on a substrate, comprising the steps of:

applying an opaque material on a surface of said substrate;

applying a photo-sensitive material on said opaque material;

baking said substrate having said opaque and opaque-sensitive material thereon for a period of time so as to cure said opaque and photo-sensitive material;

forming a beat pattern by simultaneously superimposing first and second pairs of symmetric beams of light of the same monochromatic wavelength on a surface of said photo-sensitive material to produce an interference pattern thereon, wherein the first plane wave of light of said first pair is incident on said surface at a first angle of incidence $\theta$ subtending from the normal of the surface, wherein the second plane wave of light of said first pair is incident on said surface at a second angle of incidence $-\theta$ subtending from the normal of the surface, wherein the first plane wave of light of said second pair is incident on said surface at a third angle of incidence $\phi$ subtending from the normal of the surface, and wherein the second plane wave of light of said second pair is incident on said surface at a fourth angle of incidence $-\phi$ subtending from the normal of the surface;

controllably developing said photo-sensitive material so as to yield an exposed region of opaque material, wherein the beat pattern includes fine interference structure having a varying intensity defining coarse interference structure that defines a desired optical periodic structure; wherein the substrate is dithered perpendicular to the interference pattern during said exposure step to wash out the fine interference structure while preserving the coarse interference structure;

preferentially etching said exposed region of opaque material; and stripping remaining undeveloped photo-sensitive material.

14. The method of claim 13, wherein $\theta<\phi<90°$.

15. The method of claim 14, wherein $\theta$ and $\phi$ differ by approximately 5.50° for a wavelength of said light of approximately 0.488 μm.

16. The invention of claim 13 wherein said coarse structure has a period that is substantially greater than the wavelength of light of said first and second pairs of symmetric beams of light.

* * * * *